United States Patent [19]

Fierkens

[11] Patent Number: 5,443,101
[45] Date of Patent: Aug. 22, 1995

[54] MODULAR ELECTROMECHANICAL PRESS AND METHOD THEREFOR

[76] Inventor: Richard H. J. Fierkens, Kuerbeck 15, 6914 AE Herwen, Netherlands

[21] Appl. No.: 162,717

[22] Filed: Dec. 6, 1993

[51] Int. Cl.$^6$ .............................................. B21F 1/00
[52] U.S. Cl. ...................................... 140/105; 72/405; 83/929.2
[58] Field of Search ................ 29/566.3, 34 D, 827; 83/929.2; 72/405; 140/105

[56] References Cited

U.S. PATENT DOCUMENTS

| | | | |
|---|---|---|---|
| 5,335,702 | 8/1994 | Goto | 140/105 |
| 5,346,055 | 9/1994 | Zierpka | 72/405 |

FOREIGN PATENT DOCUMENTS

| | | | |
|---|---|---|---|
| 2197335 | 8/1990 | Japan | 72/405 |

*Primary Examiner*—P. W. Echols
*Attorney, Agent, or Firm*—Harry M. Weiss; Jeffrey D. Moy

[57] ABSTRACT

A modular electromechanical press apparatus and method for using such an apparatus for trimming excess portions from a leadframe strip package having a semiconductor chip thereon and for forming leads of the leadframe extending from the semiconductor chip is disclosed. The apparatus provides an electric motor for driving a plurality of coupled shafts. Two of the shafts include flywheels for reducing the load on the motor once the shafts reach steady state rotational velocity. In addition, each of these two shafts are provided with a one stroke clutch, so that upon activation of the clutches, one shaft moves a leadframe strip into proper position, and the other shaft drives a tool at the proper time to execute the desired trimming or forming operation. The unique arrangement of the components of the apparatus provides maximum power in a minimum size unit that can easily be incorporated into an in-line system for producing semiconductor packages.

20 Claims, 4 Drawing Sheets

MODULAR ELECTROMECHANICAL PRESS AND METHOD THEREFOR

RELATED APPLICATION

This patent application is related to U.S. patent application Ser. No. 08/162,716 entitled "AN ELECTROMECHANICAL PRESS AND METHOD THEREFOR", filed concurrently herewith in the name of the same inventor, and is incorporated herein by reference.

BACKGROUND OF THE INVENTION

1. Field of the Invention

This invention relates generally to electromechanical press apparatus and, more specifically, to a modular electromechanical press apparatus and a method therefor which provide at least two axes each having a flywheel that are driven by at least one electric motor in order to maximize the amount of power provided by the press while minimizing the size of the press.

2. Description of the Related Art

In general today, manufacturers are moving toward smaller, more compact machinery in order to reduce the size and cost of their manufacturing facilities. In the semiconductor industry, there has been a shift toward reducing the size of the various machines that perform such functions as wire bonding, plastic molding, post mold curing, dambar cutting, trimming, and forming. To further reduce the size of a semiconductor manufacturing facility, the trend has been to not only reduce the size of the production machinery but also to build machines in a modular manner that allows the machines to be quickly and easily coupled together in an in-line fashion.

Prior art press type machines used for trimming and forming semiconductor packages have not been capable of providing sufficient power in a unit of sufficiently small size. In addition, prior art press units employing hydraulic presses are problematic for use in the clean room environment that is generally associated with the production of semiconductor packages. Therefore, there existed a need to provide a modular electromechanical type press used for trimming and forming semiconductor packages and their associated leadframe strips that provides maximum press power per unit volume of the machine.

SUMMARY OF THE INVENTION

In accordance with one embodiment of this invention, it is an object of this invention to provide a modular electromechanical press apparatus for trimming excess portions from a leadframe strip package having a semiconductor chip thereon and for forming leads of the leadframe extending from the semiconductor chip.

It is another object of this invention to provide a method of operating a modular electromechanical press apparatus for trimming excess portions from a leadframe strip package having a semiconductor chip thereon and for forming leads of the leadframe extending from the semiconductor chip.

It is a further object of this invention to provide a modular electromechanical press apparatus for use in the production of semiconductor packages that is of minimum size while providing maximum power.

It is a another object of this invention to provide a modular electromechanical press apparatus for use in the production of semiconductor packages that can be quickly and easily implemented with an in-line assembly process such that as there are variations in package size and in leadframe cutouts for different semiconductor devices, the apparatus has a high level of flexibility and a short change out time from one semiconductor device to another.

BRIEF DESCRIPTION OF THE PREFERRED EMBODIMENTS

In accordance with one embodiment of this invention, a modular electromechanical press apparatus for trimming excess portions from a leadframe strip package having a semiconductor chip thereon and for forming leads of the leadframe extending from the semiconductor chip is disclosed comprising, in combination, first shaft means for producing movement of the leadframe strip, second shaft means coupled to the first shaft means for causing the trimming of the excess portions from the leadframe strip and for causing the forming of the leads of the leadframe extending from the semiconductor chip, and rotation means coupled to both the first shaft means and the second shaft means for simultaneously rotating the first shaft means and the second shaft means. This apparatus also includes third shaft means coupled to the first shaft means, the second shaft means, and the rotation means for transferring power from the rotation means simultaneously to both the first shaft means and the second shaft means. In addition, this apparatus further includes power reserving means coupled to the first shaft means and to the second shaft means for reducing mechanical and electrical loads on the rotation means. This apparatus includes motion translation means coupled to the first shaft means for permitting the translation of a circular motion of the first shaft means to a substantially rectangular motion of the motion translation means for moving the leadframe strip. The activation of a first clutch means coupled to the first shaft means permits one complete rotation of the circular motion of the first shaft means to cause one complete rectangular motion of the motion translation means for moving the leadframe strip. Similarly, the activation of a second clutch means coupled to the second shaft means permits one complete rotation of the eccentrically coupled disc to cause the plunger to complete one complete cycle of moving downward and moving upward substantially along a line perpendicular to the leadframe strip to perform at least one of the trimming of the excess portions from the leadframe strip and the forming of the leads extending from the semiconductor chip. Also, the apparatus includes tool means coupled to the plunger for performing at least one of the trimming of the excess portions from the leadframe strip and the forming of the leads extending from the semiconductor chip.

In accordance with another embodiment of this invention, a method of operating a modular electromechanical press apparatus for trimming excess portions from a leadframe strip package having a semiconductor chip thereon and for forming leads of the leadframe extending from the semiconductor chip is provided comprising the steps of providing first shaft means for producing movement of the leadframe strip, providing second shaft means coupled to the first shaft means for causing the trimming of the excess portions from the leadframe strip and for causing the forming of the leads of the leadframe extending from the semiconductor chip, and providing rotation means coupled to both the first shaft means and the second shaft means for simultaneously rotating the first shaft means and the second shaft means. This method further includes the step of providing third shaft means coupled to the first shaft means, the second shaft means, and the rotation means for transferring power from the rotation means simultaneously to both the first shaft means and the second shaft means. In addition, this method includes the step of providing power reserving means coupled to the first shaft means and to the second shaft means for reducing mechanical and electrical loads on the rotation means. Moreover, this method includes the step of providing motion translation means coupled to the first shaft means for permitting the translation of a circular motion of the first shaft means to a substantially rectangular motion of the motion translation means for moving the leadframe strip. As part of this method, the activation of a first clutch means coupled to the first shaft means permits one complete rotation of the circular motion of the first shaft means to cause one complete rectangular motion of the motion translation means for moving the leadframe strip. Similarly, the activation of a second clutch means coupled to the second shaft means permits one complete rotation of the eccentrically coupled disc to cause the plunger to complete one complete cycle of moving downward and moving upward substantially along a line perpendicular to the leadframe strip to perform at least one of the trimming of the excess portions from the leadframe strip and the forming of the leads extending from the semiconductor chip. This method further includes the step of providing tool means coupled to the plunger for performing at least one of the trimming of the excess portions from the leadframe strip and the forming of the leads extending from the semiconductor chip.

The foregoing and other objects, features, and advantages of the invention will be apparent from the following, more particular, description of the preferred embodiments of the invention, as illustrated in the accompanying drawings.

BRIEF DESCRIPTION OF THE DRAWINGS

FIG. 4A is a more detailed view of a portion of the cross sectional view of FIG. 4.

DESCRIPTION OF THE PREFERRED EMBODIMENT

Figure 1:
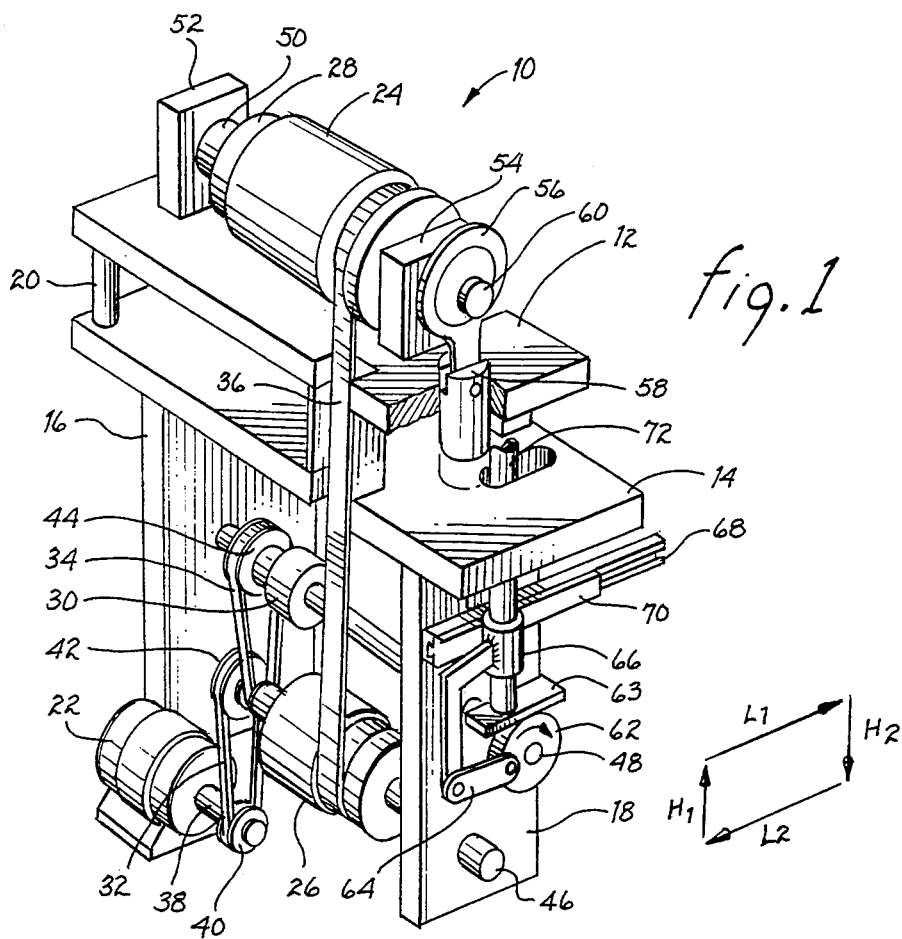
FIG. 1 is a perspective view of one embodiment of the modular electromechanical press apparatus.

Referring to FIG. 1, one embodiment of the modular electromechanical press apparatus is shown and is generally designated by reference number 10. Support for the apparatus 10 is provided by an upper support plate 12, a lower support plate 14, and side support plates 16 and 18. The upper support plate 12 is separated from the lower support plate 14 by vertical supports 20. Note that the side support plates 16 and 18 provide bearing support surfaces for end portions of the direct drive axis 46 and the leadframe drive axis 48. End portions of the plunger drive axis 50 are provided bearing support by bearings 52 and 54. An electric motor 22 is used to drive the three axes 50, 48, and 46. The motor shaft 38 rotates the pulley 40 which drives the drive belt 32 which in turn rotates the direct drive axis 46 via the pulley 42. The direct drive axis 46 is coupled to the leadframe drive axis 48 via the drive belt 34 which rotates the pulley 44. The direct drive axis 46 is also coupled to the plunger drive axis 50 via the drive belt 36. In short, the electric motor 22 rotates the direct drive axis 46 via the drive belt 32, and the direct drive axis 46 transfers rotational motion to the leadframe drive axis 48 and the plunger drive axis 50 via the drive belts 34 and 36, respectively. The direct drive axis 46 is provided with a flywheel 26, and the plunger drive axis 50 is provided with a flywheel 24. The advantage of having these flywheels 24 and 26 is that once the axes 50, 48, and 46 are up to steady state rotational velocity, the amount of power required of the electric motor 22 to keep the axes 50, 48, and 46 rotating is minimized due to the inertia associated with the flywheels 24 and 26. Both the plunger drive axis 50 and the leadframe drive axis 48 are provided with one-stroke clutches 28 and 30, respectively. The one-stroke clutches 28 and 30 are disengaged to allow their respective axes 50 and 48 to rotate, thereby maintaining the rotational inertia associated with the flywheels 24 and 26. When external control signals cause the one-stroke clutches 28 and 30 to engage, the plunger drive axis 50 and the leadframe drive axis 48 are engaged to synchronously perform their respective functions.

When the leadframe drive axis 48 is engaged by the one-stroke clutch 30, the axis 48 rotates the disc 62 to complete one revolution. The disc 62 is coupled via the connecting member 64 to a guide bush 66. The guide bush 66 rests on a mechanical stop 63. In addition, the guide bush 66 is coupled to a guide rail 70 that slides along a guide rail retainer 68. The connecting rod 72 is also coupled to the guide bush 66. The lower support plate 14 is provided with a slot through which the connecting rod 72 is constrained.

With the connecting rod 72 in a position as shown in FIG. 1, when the disc 62 begins to rotate as shown in the clockwise direction, the guide bush 66 and the connecting rod 72 move upward in a motion similar to H1. As the connecting rod 72 reaches the top of the H1 motion and as the disc 62 continues to rotate, the connecting rod 72 begins the L1 movement as the guide rail 70 moves to the right along the guide rail retainer 68. At the end of the L1 movement, the connecting rod 72 moves down along the H2 movement as the guide bush 66 is pulled down due to the motion of the disc 62. As the disc 62 completes one revolution, the guide rail 70 moves to the left along the guide rail retainer 68, thus moving the connecting rod 72 along the L2 movement. In short, the circular motion associated with the single rotation of the disc 62 is transformed via the interaction of the connecting member 64, the guide bush 66, the mechanical stop 63, the guide rail retainer 68, and the guide rail 70 into the rectangular motion H1, L1, H2, and L2 of the connecting rod 72.

When the plunger drive axis 50 is engaged by the one-stroke clutch 28, the axis 50 rotates the disc 56 to complete one revolution. The disc 56 is connected to a plunger 58 that can be coupled to various tools for performing operations such as trimming and forming on a leadframe strip package. Note that the disc 56 is eccentrically coupled to the axis 50 at the connection 60. It is this eccentric connection 60 that causes a linear downward stroke followed by a linear upward stroke of the plunger 58.

Figure 2:
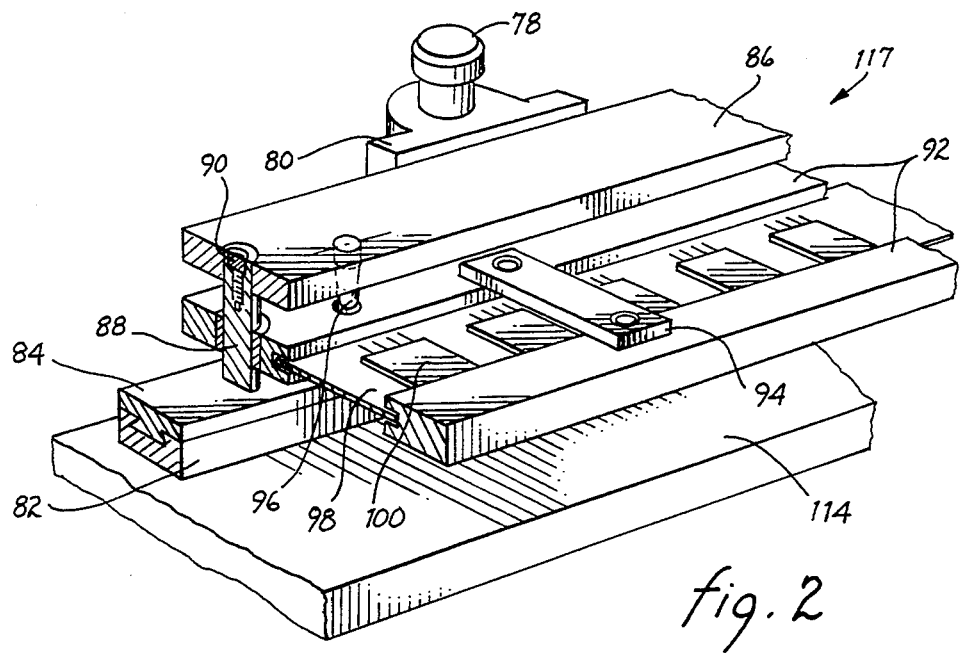
FIG. 2 is a perspective view of a leadframe strip transport device that is used in conjunction with both of the embodiments of the modular electromechanical press apparatus shown in FIGS. 1 and 6.
Figure 3:
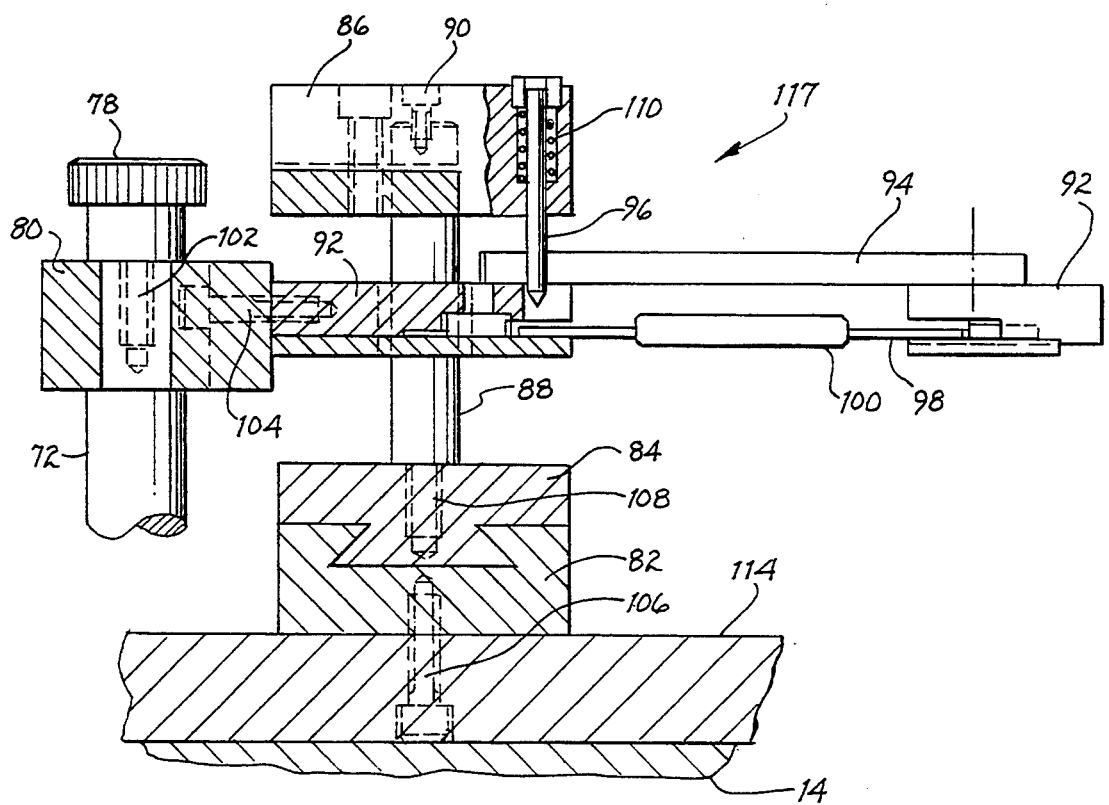
FIG. 3 is a cross sectional view of the leadframe strip transport device shown in FIG. 2.

Referring to FIGS. 2 and 3, a leadframe strip transport device is shown and is generally designated by reference number 117. The connecting rod 72 is coupled to the connecting rod knob 78 through the leadframe strip guide rail interface 80 by the connector 102. The leadframe strip guide rail interface 80 is coupled to the leadframe strip guide rail 92 by the connector 104. A bottom tool 114 is coupled to the lower support plate 14. The guide member 82 is fixedly coupled to the bottom tool 114 by the connector 106, and the member 84 is slideably coupled to the guide member 82. A guide shaft 88 is fixed to the members 84 and 86 by connectors 108 and 90, respectively. The guide shaft 88 also passes through a hole in the leadframe strip guide rail 92. Note that the leadframe strip guide rail 92 is held together by a member 94. A slot is formed in the leadframe strip guide rail 92 for retaining the leadframe strip 98 including semiconductor packages 100. The member 86 is provided with a transport pin 96 that is spring loaded by the spring 110.

Referring to FIGS. 1-3, when the connecting rod 72 moves upward along the H1 path of motion, the leadframe strip guide rail interface 80 moves the leadframe strip guide rail 92 upward. Note that since the members 84 and 86 are not connected to the leadframe strip guide rail interface 80, these members do not move upward. As the leadframe strip guide rail 92 moves upward, the transport pin 96 passes through a hole in the leadframe strip guide rail 92 and into a hole (not shown) in the leadframe strip 98 itself. The connecting rod 72 then moves along the L1 path of motion, thereby moving the member 84, the guide shaft 88, the leadframe strip guide rail 92, the member 86, and the leadframe strip 98 along the L1 path of motion. When the connecting rod 72 moves along the H2 path of motion, the leadframe strip guide rail 92 also moves downward to disengage the transport pin 96 from both the leadframe strip 98 and the leadframe strip guide rail 92. After completing the H1, L1, and H2 movements, the plunger 58 and its associated tool move down to perform the required trimming or forming operation on the combined leadframe strip 98 and semiconductor package 100 against the bottom tool 114. As the leadframe strip 98 and the semiconductor package 100 are, in effect, held in place between an upper tool 116 (see FIG. 5) and the bottom tool 114, the connecting rod 72 moves back along the L2 path of motion to move the member 84, the guide shaft 88, the leadframe strip guide rail 92, and the member 86 back to their original locations. Of course, the grip on the leadframe strip 98 is no longer required to hold the strip in place once the member 84, the guide shaft 88, the leadframe strip guide rail 92, and the member 86 back to their original locations, therefore, the plunger 58 moves back up to release the leadframe strip 98. This synchronized cycle of performing a trimming or a forming operation and shifting to the next portion of the leadframe strip 98 and associated semiconductor package 100 to be worked on is repeatedly executed in order to perform the required operation on the entire length of the leadframe strip 98 with the associated semiconductor packages 100.

Figure 4:
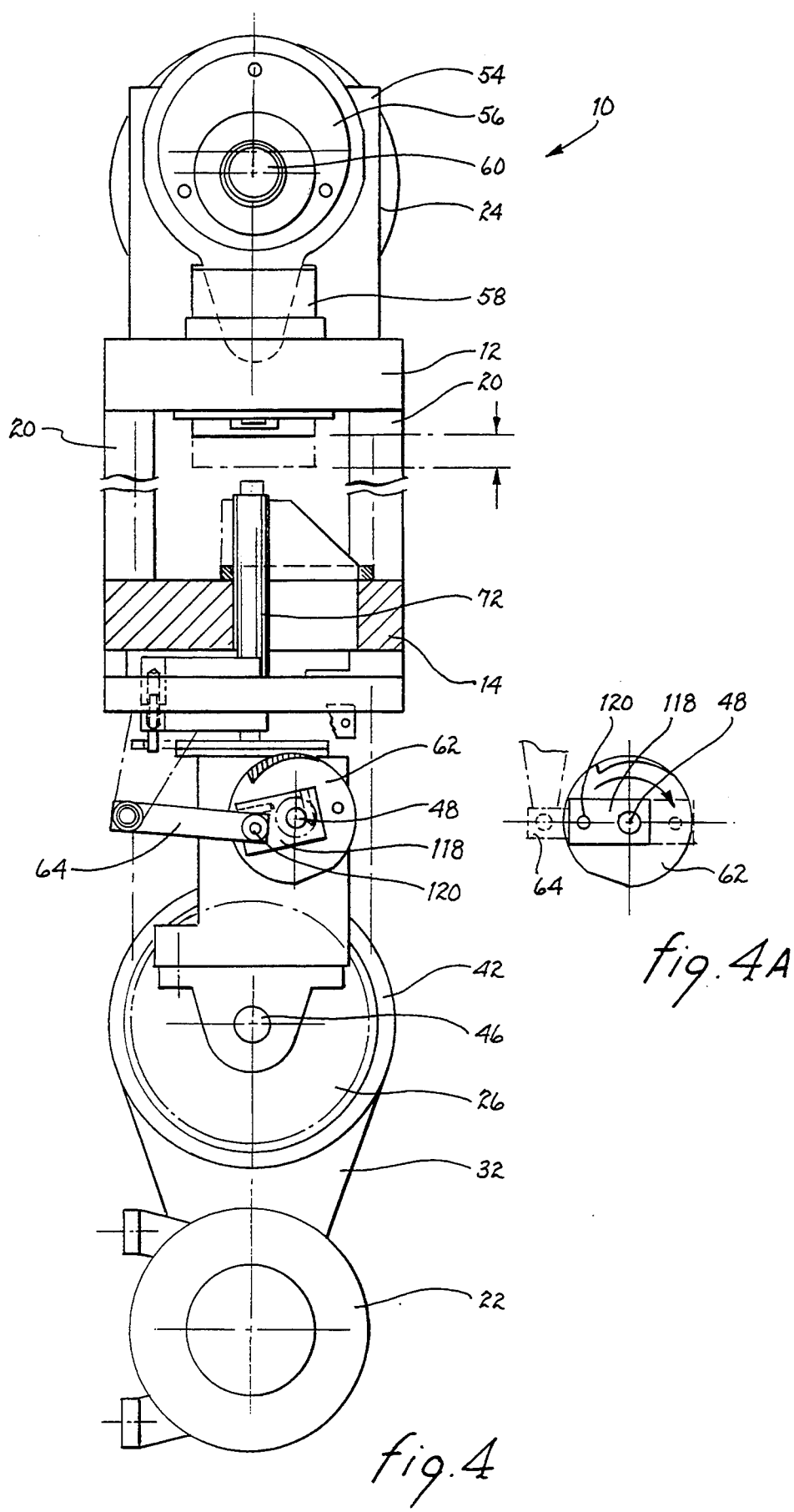
FIG. 4 is a cross sectional view taken along the widthwise dimension of the modular electromechanical press apparatus of FIG. 1.
Figure 5:
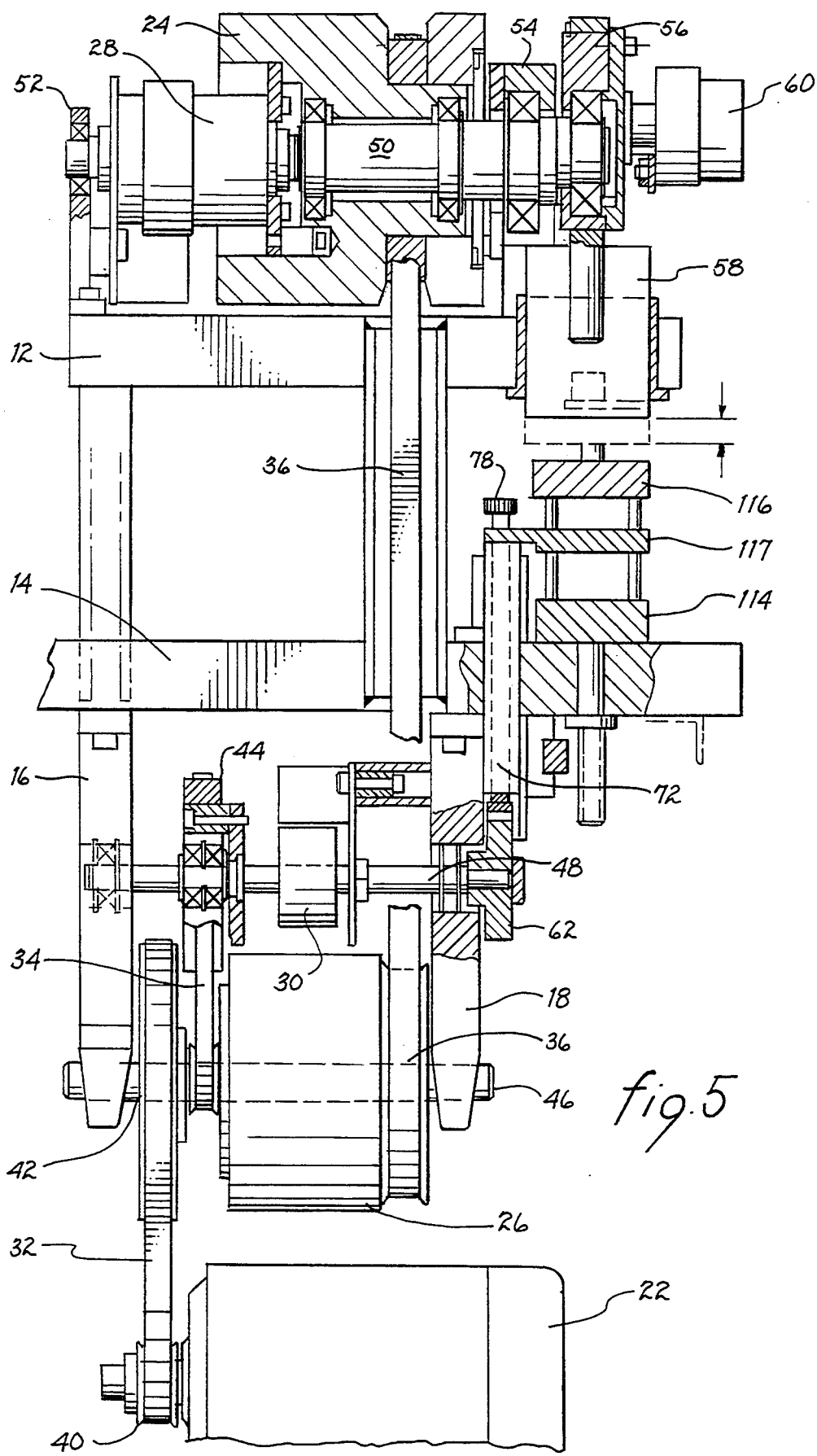
FIG. 5 is a cross sectional view taken along the lengthwise dimension of the modular electromechanical press apparatus of FIG. 1.

Referring to FIGS. 4 and 5, widthwise and lengthwise cross sectional views of the modular electromechanical press apparatus 10 from FIG. 1 are shown, respectively. Note that the upper tool 116 and the bottom tool 114 are shown in FIG. 5. In FIGS. 4 and 4A, the disc 62 is coupled to a stroke adjustment plate 118, and the connecting member 64 is coupled to the stroke adjustment plate 118 by the connector 120. The linear distance between the centerline of the connector 120 and the centerline of the connector at the axis 48 turns out to be ½ of the distance of each of the L1 and L2 movements. Consequently, by changing the size of the stroke adjustment plate 118, the length of the L1 and L2 movements can be changed.

Figure 6:
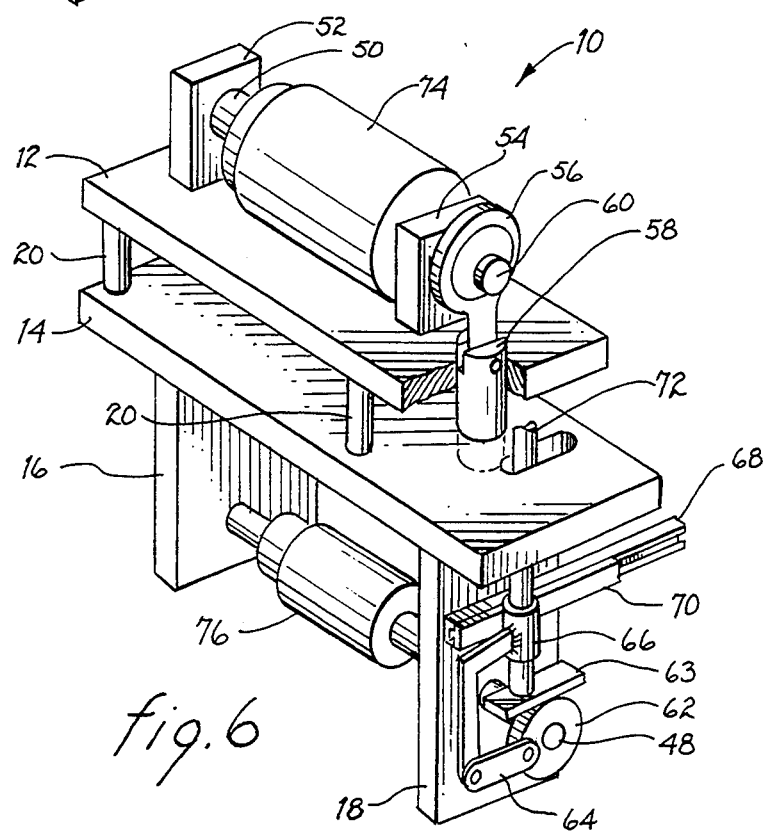
FIG. 6 is a perspective view of a second embodiment of the modular electromechanical press apparatus.

Referring to FIG. 6, another embodiment of the modular electromechanical press apparatus 10 is shown. Support for the apparatus 10 is provided by the upper support plate 12, the lower support plate 14, and side support plates 16 and 18. The upper support plate 12 is separated from the lower support plate 14 by vertical supports 20. Note that the side support plates 16 and 18 provide bearing support surfaces for end portions of the axis of an electric motor 76. End portions of an axis for another electric motor 74 are supported by bearings 52 and 54. The rotors of both motors 74 and 76 are analogous to the flywheels 24 and 26 of the embodiment shown in FIG. 1. In addition, each of the motors 74 and 76 are provided with an internal stroke clutch brake that is comparable to the one-stroke clutches 28 and 30 provided in the embodiment shown in FIG. 1. The internal stroke clutch brake for each of the motors 74 and 76 allows the axis for each of the motors 74 and 76 to rotate, thereby maintaining the rotational inertia associated with the rotor of each motor 74 and 76. When external control signals cause the internal stroke clutch brake of each motor 74 and 76 to engage, the axis of each motor 74 and 76 is engaged to perform the desired functions.

When the axis of motor 76 is engaged, the axis rotates the disc 62 to complete one revolution. The disc 62 is coupled via a connecting member 64 to a guide bush 66. The guide bush 66 rests on a mechanical stop 63. In addition, the guide bush 66 is coupled to a guide rail 70 that slides along a guide rail retainer 68. The connecting rod 72 is also coupled to the guide bush 66. The lower support plate 14 is provided with a slot through which the connecting rod 72 is constrained.

With the connecting rod 72 in a position as shown in FIG. 6, when the disc 62 begins to rotate in the clockwise direction, the guide bush 66 and the connecting rod 72 move upward in a motion similar to H1. As the connecting rod 72 reaches the top of the H1 motion and as the disc 62 continues to rotate, the connecting rod 72 begins the L1 movement as the guide rail 70 moves to the right along the guide rail retainer 68. At the end of the L1 movement, the connecting rod 72 moves down along the H2 movement as the guide bush 66 is pulled down due to the motion of the disc 62. As the disc 62 completes one revolution, the guide rail 70 moves to the left along the guide rail retainer 68, thus moving the connecting rod 72 along the L2 movement. In short, the circular motion associated with the single rotation of the disc 62 is transformed via the interaction of the connecting member 64, the guide bush 66, the mechanical stop 63, the guide rail retainer 68, and the guide rail 70 into the rectangular motion H1, L1, H2, and L2 of the connecting rod 72.

When the axis of the motor 74 is engaged, the axis rotates the disc 56 to complete one revolution. The disc 56 is connected to a plunger 58 that can be coupled to various tools for performing operations such as trimming and forming on a leadframe strip package. Note that the disc 56 is eccentrically coupled to the axis of the motor 74 at the connection 60. It is this eccentric connection 60 that causes a linear downward stroke followed by a linear upward stroke of the plunger 58.

The embodiment of the modular electromechanical press apparatus 10 of FIG. 6 implements the use of the leadframe strip transport device 117 in a manner similar to the manner previously described for the embodiment of the apparatus 10 shown in FIG. 1. In addition, the embodiment of the modular electromechanical press apparatus 10 of FIG. 6 uses an upper tool and a bottom tool (not shown) similar to the tools 116 and 114 used by the embodiment of the apparatus 10 shown in FIG. 1.

OPERATION

Referring to FIGS. 1–5, once the electric motor 22 has driven the three axes 50, 48, and 46 up to steady state velocity as previously described, the apparatus 10 is ready for operation. When the leadframe drive axis 48 is engaged by the one-stroke clutch 30, the axis 48 rotates the disc 62 to complete one revolution. When the disc 62 begins to rotate as shown in the clockwise direction, the guide bush 66 and the connecting rod 72 move upward in a motion similar to H1. As the connecting rod 72 reaches the top of the H1 motion and as the disc 62 continues to rotate, the connecting rod 72 begins the L1 movement as the guide rail 70 moves to the right along the guide rail retainer 68. At the end of the L1 movement, the connecting rod 72 moves down along the H2 movement as the guide bush 66 is pulled down due to the motion of the disc 62. As the disc 62 completes one revolution, the guide rail 70 moves to the left along the guide rail retainer 68, thus moving the connecting rod 72 along the L2 movement.

When the connecting rod 72 moves upward along the H1 path of motion, the leadframe strip guide rail interface 80 moves the leadframe strip guide rail 92 upward. As the leadframe strip guide rail 92 moves upward, the transport pin 96 passes through a hole in the leadframe strip guide rail 92 and into a hole (not shown) in the leadframe strip 98 itself. The connecting rod 72 then moves along the L1 path of motion, thereby moving each of the member 84, the guide shaft 88, the leadframe strip guide rail 92, the member 86, and the leadframe strip 98 along the L1 path of motion. When the connecting rod 72 moves downward H2, the leadframe strip guide rail 92 also moves downward to disengage the transport pin 96 from both the leadframe strip 98 and the leadframe strip guide rail 92.

After completing the H1, L1, and H2 movements, the plunger 58 and the associated tool 116 move down to perform the required trimming or forming operation on the leadframe strip 98 against the bottom tool 114 in the following manner. When the plunger drive axis 50 is engaged by the one-stroke clutch 28, the axis 50 rotates the disc 56 to complete one revolution. The disc 56 is connected to a plunger 58 that can be coupled to various tools for performing operations such as trimming and forming on a leadframe strip package. Since the disc 56 is eccentrically coupled to the axis 50 at the connection 60, the rotation of the disc 56, causes a linear downward stroke followed by a linear upward stroke of the plunger 58. The force on the leadframe strip 98 provided by the upper tool 116 moving down toward the bottom tool 114 executes the desired trimming or forming operation. Since the leadframe strip 98 and semiconductor package 100 are, in effect, held in place by the upper tool 116 and the bottom tool 114, the connecting rod 72 moves back along the L2 path of motion to move each of the member 84, the guide shaft 88, the leadframe strip guide rail 92, and the member 86 back to their original locations. This synchronized cycle of performing a trimming or a forming operation and shifting to the next portion of the leadframe strip 98 and associated semiconductor package 100 to be worked on is repeatedly executed in order to perform the required operation on the entire length of the leadframe strip 98 with the associated semiconductor packages 100.

Referring to FIGS. 2, 3, and 6, once the electric motors 74 and 76 are up to steady state velocity, the embodiment of the apparatus 10 shown in FIG. 6 is ready for operation. When the axis of motor 76 is engaged by an external control signal, the axis rotates the disc 62 to complete one revolution. When the disc 62 begins to rotate in the clockwise direction, the guide bush 66 and the connecting rod 72 move upward in a motion similar to H1. As the connecting rod 72 has reached the top of the H1 motion and as the disc 62 continues to rotate, the connecting rod begins the L1 movement as the guide rail 70 moves to the right along the guide rail retainer 68. At the end of the L1 movement, the connecting rod 72 moves down along the H2 movement as the guide bush 66 is pulled down due to the motion of the disc 62. As the disc 62 completes one revolution, the guide rail 70 moves to the left along the guide rail retainer 68, thus moving the connecting rod 72 along the L2 movement.

When the axis of the motor 74 is engaged, the axis rotates the disc 56 to complete one revolution. The disc 56 is connected to a plunger 58 that can be coupled to various tools for performing operations such as trimming and forming on a leadframe strip package. Since the disc 56 is eccentrically coupled to the axis of the motor 74 at connection 60, the rotation of the disc 56 causes a linear downward stroke followed by a linear upward stroke of the plunger 58. Note that this embodiment of the modular electromechanical press apparatus 10 implements the use of the leadframe strip transport device 117 in a manner similar to the manner previously described for the embodiment of the apparatus 10 shown in FIG. 1. In addition, this embodiment of the modular electromechanical press apparatus 10 of FIG. 6 uses an upper tool and a bottom tool (not shown) similar to the tools 116 and 114 used by the embodiment of the apparatus 10 shown in FIG. 1.

While the invention has been particularly shown and described with reference to the preferred embodiments thereof, it will be understood by those skilled in the art that the foregoing and other changes in form and details may be made therein without departing from the spirit and scope of the invention. For example, an arrangement similar to that used by the apparatus 10 to drive the plunger 58 and the upper tool 116 could be used to drive the bottom tool 114. The unique arrangement of the elements of the apparatus 10 allows the apparatus 10 to be of minimum size while maintaining maximum press power. For example, the width of the apparatus 10 can be as small as approximately 10 inches wide while providing a press capacity of approximately 6 metric tons.

What is claimed is:

1. A modular electromechanical press apparatus for trimming excess portions from a leadframe strip package having a semiconductor chip thereon and for forming leads of said leadframe extending from said semiconductor chip comprising, in combination:
   first shaft means for producing movement of said leadframe strip;
   second shaft means coupled to said first shaft means for causing said trimming of said excess portions from said leadframe strip and for causing said forming of said leads of said leadframe extending from said semiconductor chip; and
   rotation means coupled to both said first shaft means and said second shaft means for simultaneously rotating said first shaft means and said second shaft means.

2. The apparatus of claim 1 further including third shaft means coupled to said first shaft means, said second shaft means, and said rotation means for transferring power from said rotation means simultaneously to both said first shaft means and said second shaft means.

3. The apparatus of claim 1 further including power reserving means coupled to said first shaft means and to said second shaft means for reducing mechanical and electrical loads on said rotation means.

4. The apparatus of claim 2 further including a plurality of belts coupled between said rotation means and said third shaft means, said third shaft means and said second shaft means, and said third shaft means and said first shaft means.

5. The apparatus of claim 1 further including motion translation means coupled to said first shaft means for permitting the translation of a circular motion of said first shaft means to a substantially rectangular motion of said motion translation means for moving said leadframe strip.

6. The apparatus of claim 1 wherein said second shaft means is eccentrically coupled to a disc for moving a plunger coupled to said disc to trim said excess portions from said leadframe strip and to form said leads extending from said semiconductor chip.

7. The apparatus of claim 5 wherein activation of a first clutch means coupled to said first shaft means for permitting one complete rotation of said circular motion of said first shaft means causing one complete rectangular motion of said motion translation means for moving said leadframe strip.

8. The apparatus of claim 6 wherein activation of a second clutch means coupled to said second shaft means for permitting one complete rotation of said eccentrically coupled disc causing said plunger to complete one complete cycle of moving downward and moving upward substantially along a line perpendicular to said leadframe strip to perform at least one of said trimming of said excess portions from said leadframe strip and said forming of said leads extending from said semiconductor chip.

9. The apparatus of claim 1 wherein said movement of said leadframe strip is synchronized with said trimming of said excess portions from said leadframe strip and with said forming of said leads extending from said semiconductor chip.

10. The apparatus of claim 8 further including tool means coupled to said plunger for performing at least one of said trimming of said excess portions from said leadframe strip and said forming of said leads extending from said semiconductor chip.

11. A method of operating a modular electromechanical press apparatus for trimming excess portions from a leadframe strip package having a semiconductor chip thereon and for forming leads of said leadframe extending from said semiconductor chip comprising the steps of:
   providing first shaft means for producing movement of said leadframe strip;
   providing second shaft means coupled to said first shaft means for causing said trimming of said excess portions from said leadframe strip and for causing said forming of said leads of said leadframe extending from said semiconductor chip; and
   providing rotation means coupled to both said first shaft means and said second shaft means for simultaneously rotating said first shaft means and said second shaft means.

12. The method of claim 11 further including the step of providing third shaft means coupled to said first shaft means, said second shaft means, and said rotation means for transferring power from said rotation means simultaneously to both said first shaft means and said second shaft means.

13. The method of claim 11 further including the step of providing power reserving means coupled to said first shaft means and to said second shaft means for reducing mechanical and electrical loads on said rotation means.

14. The method of claim 12 further including the step of providing a plurality of belts coupled between said rotation means and said third shaft means, said third shaft means and said second shaft means, and said third shaft means and said first shaft means.

15. The method of claim 11 further including the step of providing motion translation means coupled to said first shaft means for permitting the translation of a circular motion of said first shaft means to a substantially rectangular motion of said motion translation means for moving said leadframe strip.

16. The method of claim 11 wherein said second shaft means is eccentrically coupled to a disc for moving a plunger coupled to said disc to trim said excess portions from said leadframe strip and to form said leads extending from said semiconductor chip.

17. The method of claim 15 wherein activation of a first clutch means coupled to said first shaft means for permitting one complete rotation of said circular motion of said first shaft means causing one complete rectangular motion of said motion translation means for moving said leadframe strip.

18. The method of claim 16 wherein activation of a second clutch means coupled to said second shaft means for permitting one complete rotation of said eccentrically coupled disc causing said plunger to complete one complete cycle of moving downward and moving upward substantially along a line perpendicular to said leadframe strip to perform at least one of said trimming of said excess portions from said leadframe strip and said forming of said leads extending from said semiconductor chip.

19. The method of claim 11 wherein said movement of said leadframe strip is synchronized with said trimming of said excess portions from said leadframe strip and with said forming of said leads extending from said semiconductor chip.

20. The method of claim 18 further including the step of providing tool means coupled to said plunger for performing at least one of said trimming of said excess portions from said leadframe strip and said forming of said leads extending from said semiconductor chip.

* * * * *